(12) United States Patent
Matsuyoshi et al.

(10) Patent No.: US 6,507,253 B1
(45) Date of Patent: Jan. 14, 2003

(54) DELAY CIRCUIT AND FEEDFORWARD AMPLIFIER

(75) Inventors: Toshimitsu Matsuyoshi, Katano (JP); Toru Matsuura, Katano (JP); Kaoru Ishida, Shijonawate (JP); Seiji Fujiwara, Yokosuka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/801,141

(22) Filed: Mar. 7, 2001

(30) Foreign Application Priority Data

Mar. 7, 2000 (JP) ......................................... 2000-061425

(51) Int. Cl.$^7$ ................................................ H01P 1/18
(52) U.S. Cl. ........................ 333/156; 330/151; 333/161; 333/117
(58) Field of Search ................................ 333/156, 164, 333/109, 117, 161; 330/151

(56) References Cited

U.S. PATENT DOCUMENTS 4,943,783 A * 7/1990 Nojima ........................ 330/149
6,335,665 B1 * 1/2002 Mendelsohn ................ 333/109

* cited by examiner

Primary Examiner—Robert Pascal
Assistant Examiner—Kimberly Glenn
(74) Attorney, Agent, or Firm—RatnerPrestia

(57) ABSTRACT

A delay circuit in which amplitude characteristic and delay time characteristic of the output signals do not have any ripple relative to the length of the transmission line is provided. The delay circuit includes a circuit that makes a part of signals distributed into two parts by the power divider (103) to be identical in amplitude and inverse in phase relative to the component of signals outputted from the terminal-a directly to the terminal-c of the circulator (104). By composing with the power combiner (107) both signals are offset each other at the output terminal. As a result, only the signals that are inputted from the input terminal (101) and transmitted through the circulator (104) and the open-ended transmission line (105) are outputted to the output terminal (102).

12 Claims, 11 Drawing Sheets

$$C = Be^{j\pi}$$

Fig. 11 (a) PRIOR ART
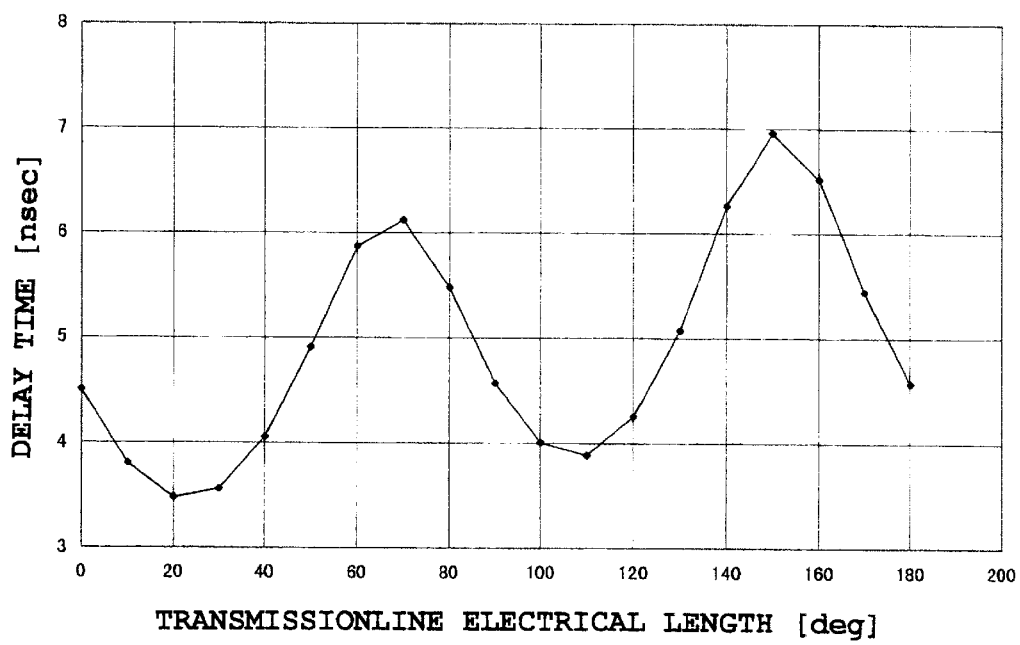
Fig. 11 (b) PRIOR ART
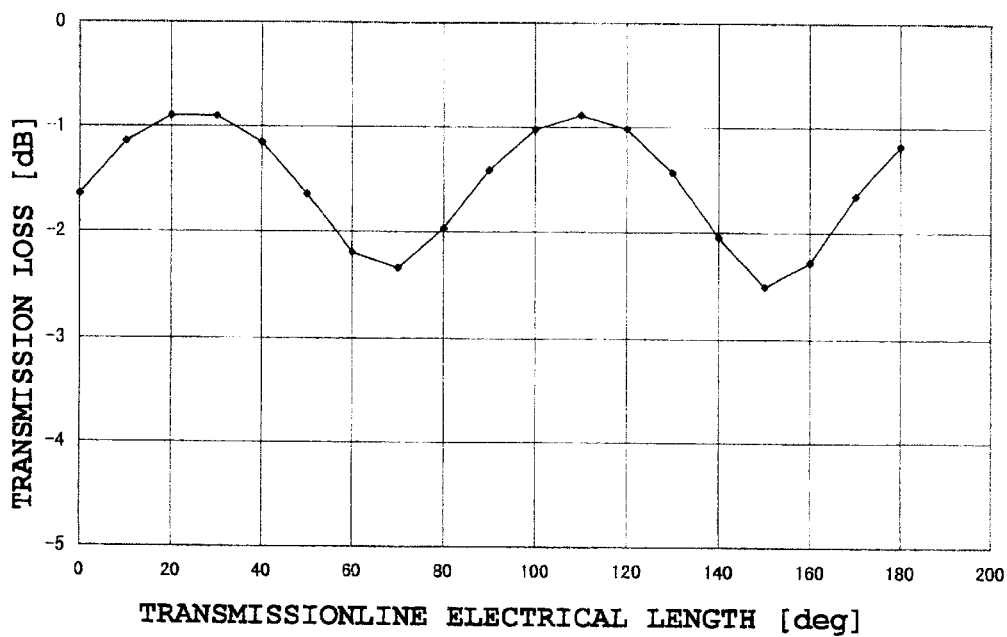

DELAY CIRCUIT AND FEEDFORWARD AMPLIFIER

BACKGROUND OF THE INVENTION

1. Field of the Invention

Present invention relates to a delay circuit and a feedforward amplifier, particularly relates to a delay circuit and a feedforward amplifier used for an amplifier in the base stations of mobile communication systems that include cellular phones or the like.

2. Description of Related Art

In recent years, for the transmission system for the mobile communication base stations, in order to amplify a plurality of signal channels as a whole, an effective power amplifier excellent in linearity has been required. Carrying out distortion compensation in a manner of feedforward provides the linearity. (Reference: John L. B. Walker, "High-Power GaAs FET Amplifiers" Artech House, 1993, pp332–333)

In the feedforward amplifier, in order to coincide the signals from different signal paths with each other, a delay circuit is required. When manufacturing a feedforward amplifier, as it is necessary to adjust the delay time of the delay circuit, it is required that the delay time of the delay circuit can be changed easily.

As a delay circuit that satisfies the requirements like these, a coaxial cable has been used. In the coaxial cable, as the length and the delay time are in a proportional relationship, by adjusting the length of the coaxial cable, fine adjustment of the delay time can be made easily.

Whereas, referring to FIG. 10, a description will be made about a conventional delay circuit that is used in a circuit other than the feedforward amplifiers described above.

In FIG. 10, reference numeral 201 denotes an input terminal; 202 denotes an output terminal; 203 denotes a circulator; and the terminals are denoted as terminal-a, terminal-b and terminal-c. Reference numeral 204 denotes an open-ended transmission line comprised of, for example, a microstrip line or the like.

In the circulator 203, it is assumed that an input signals Sa inputted from the terminal-a is outputted to the terminal-b; an input signals Sb inputted from the terminal-b is outputted to the terminal-c; and an input signals Sc inputted from the terminal-c is outputted to the terminal-a. In the structure shown in FIG. 10, as 201 is the input terminal and 202 is the output terminal, the input signal Sc does not exist actually.

In case where the terminals of the circulator 203 are sufficiently isolated (that is, in case where the signals are not transmitted from terminal-c to terminal-b; from terminal-b to terminal-a; and from terminal-a to terminal-c), the signals inputted from the input terminal 201 are transmitted along the transmission line 204 through terminal-a and terminal-b of the circulator 203, reflected totally at the open-end of the transmission line, returned along the transmission line 204 again, and are outputted to the output terminal 202 through terminal-b and terminal-c. Delay time of the input signals can be changed by changing the length of the transmission line 204. Accordingly, conventionally, in order to prepare a delay circuit having a desired delay time, the method described below has been used.

As an example thereof, a plurality of transmission lines of different length are previously prepared. And then, they are connected one by one and delay time is measured each time. Thus, the steps are repeated until a desired delay time is obtained.

Further, as another example, a plurality of delay circuits are previously prepared by connecting transmission lines of different length respectively. And then, by measuring delay time of the prepared delay circuits, the delay circuits are sorted into groups having a specific range of delay time respectively. In this manner, a plurality of delay circuits that have different specified delay times are prepared simultaneously. When a request for a delay circuit having specific delay time is made, a delay circuit that satisfies the requirements is provided from a plurality of groups of delay time.

In such a manner as described above, even when the relationship between the length of the transmission line 204 and delay time of the signals is not cleared, it is possible to manufacture desired delay circuits. Also, because the delay circuits prepared as described above are, different from the coaxial cables described above, used under a situation where a fine adjustment of delay time is not necessary, no one have directed attention to a point that, between the above-mentioned length of the transmission line and the delay time of the signals, what relationship exists. Furthermore, in actual circulators, terminals are not isolated sufficiently. For example, it is known that a part of components of signals out of the signals inputted from the terminal-a is outputted directly to the terminal-c. However, no one has known whether such leakage signals render adverse effects or not. However, even when no one knows about that, no problem was recognized.

Under such a circumstances as described above, the inventor of the invention thought whether it is possible or not to use the above-mentioned delay circuit shown in FIG. 10 as a whole or a part of the delay circuits of the above-mentioned feedforward amplifier. As described above, in the manufacturing process of the feedforward amplifier, it is necessary that the delay time of the delay circuit can be fine adjusted. Therefore, the inventor of the invention studied what relationship exists between the electrical length and the delay time of the signals at the terminal 202; that is, the electrical length of the transmission line 204 side viewed from the terminal-b of the circulator 203 (hereinafter, referred as "electrical length of the transmission line") and the delay time of the signals at the terminal 202. Furthermore, the inventor of the invention studied what relationship exists between the above-mentioned electrical length of the transmission line and the amplitude values of the signals at the output terminal 202, and obtained the results as shown in FIG. 11(A) and FIG. 11(B).

That is to say, FIG. 11(A) and FIG. 11(B) indicate the fact that both the amplitude characteristic and the delay time characteristic changes largely with ripples relative to the changes in lengthy of the open-ended transmission line 204 connected with the terminal-b of the circulator (i.e., changes of the electrical length of the transmission line 204 side viewed from the terminal-b). The reason why such characteristics appear can be assumed that, in actual circulators, as described above, in many cases, because isolation between the terminals is not made sufficiently, the signals outputted at the output terminal-c appear as a composition of the signals from the path 1 and the signals from the path 2 shown in FIG. 10.

Furthermore, the inventor of the invention discovered the problems for the first time that the leakage signals passing through the path 2 is approximately −15 dB to −20 dB, and that the leakage signals in manufacturing of the feedforward amplifier make it difficult to fine adjust the delay time. That is to say, as it is clear from FIG. 11(A), changes of the delay time are large relative to the electrical length of the transmission line 204. Furthermore, the electrical length of the transmission line 204 and the delay time are not in a proportional relationship. Therefore, it is understood that the delay time can not be fine adjusted, different from the case of the above-mentioned coaxial cable having a proportional relationship therebetween, by carrying out a simple work such as just cutting of the transmission line at a desired length or the like. In FIG. 11(A) and FIG. 11(B), the electrical length of the transmission line represented by the horizontal axis corresponds to a one-way distance of the transmission line 204.

SUMMERY OF THE INVENTION

While taking into consideration the above described problems, the present invention was made to provide a delay circuit capable to reduce fluctuation in amplitude characteristic and delay time characteristic of the output signals, comparing to a conventional manner, relative to the electrical length of the transmission line connected to a circulator as well as a feedforward amplifier using the same.

One aspect of the present invention is a delay circuit, comprising:

a power divider for distributing input signal;

a circulator having a first terminal for inputting a part of signal out of the distributed input signal, a third terminal for outputting the signal inputted to the first terminal, a second terminal interposed between the first terminal and the third terminal, in which the circulator regulates a flow direction of the signal from the first terminal to the second terminal;

an open-ended transmission line connected with the second terminal and having an open-end at an end opposite to the connected end;

a gain-phase adjustment circuit for regulating the amplitude and/ or phase of the another part of signal out of the distributed input signal;

a power combiner for outputting composite signals composed of an output signal from the third terminal and an output signal from the gain-phase adjustment circuit.

Another aspect of the present invention is a delay circuit, wherein the gain-phase adjustment circuit regulates the amplitude and phase, and the output signal from the gain-phase adjustment circuit are regulated so as to have substantially the same amplitude and substantially inverse phase relative to the signal leaked directly to the third terminal without passing through the second terminal, said leaked signal being a part of signal out of the signal inputted to the first terminal of the circulator.

Still another aspect of the present invention is a delay circuit, further comprising a delay line for delaying the phase of the other part of signal, further comprising a delay line for delaying the phase of the other part of signal, wherein the gain-phase adjustment circuit regulates the amplitude and phase of the signal from the delay line.

Yet another aspect of the present invention is a delay circuit further comprising a frequency characteristic correction element for correcting a frequency characteristic of the another part of the signal, wherein the gain-phase adjustment circuit regulates the amplitude and phase of the signals from the frequency characteristic correction element.

Still yet another aspect of the present invention is a delay circuit further comprising a frequency characteristic correction element for correcting a frequency characteristic of the signal of the another part of the signal distributed by the power divider, and a delay line for delaying the phase of the signals from the frequency characteristic correction element, wherein the gain-phase adjustment circuit regulates the amplitude and phase of the signal from the delay line.

A further aspect of the present invention is a delay circuit wherein the frequency characteristic of the frequency characteristic correction element is substantially the same as a frequency characteristic of a leaked signal of the circulator.

A still further aspect of the present invention is a delay circuit, wherein the frequency characteristic of said leaked signal is a frequency characteristic of the signal leaked directly to the third terminal without passing through the second terminal, said leaked signal being a part of signal out of the signal inputted to the first terminal.

A yet further aspect of the present invention is a delay circuit, wherein the frequency characteristic correction element is a circulator having a fourth terminal, a fifth terminal and a six terminal, wherein the fourth terminal inputs the another part of signal distributed by the distributor, the sixth terminal outputs signal, the fifth terminal is connected with a terminal resistance.

A still yet further aspect of the present invention is a delay circuit, wherein the frequency characteristic correction element is an isolator.

An additional aspect of the present invention is a delay circuit as in any of the proceeding inventions, wherein a capacitor is interposed between the open-end and the grounding terminal of the open-ended transmission line.

A still additional aspect of the present invention is a delay circuit, wherein the capacitor is a varactor diode.

A yet additional aspect of the present invention is a feedforward amplifier, comprising:

a first power divider for distributing input signal;

a first delay circuit for delaying phase of a part of signal distributed by the first power divider;

a first gain-phase adjustment circuit for regulating the amplitude and the phase of the signal from the first delay circuit;

a main amplifier for amplifying an output signals from the first gain-phase adjustment circuit;

a second power divider for distributing output signal from the main amplifier a second delay circuit for delaying phase of the other part of signal distributed by the first power divider;

a distortion detection power combiner for composing signal from the second delay circuit and a part of signal distributed by the second power divider;

a third delay circuit for delaying phase of the output signal from the distortion detection power combiner;

a second gain-phase adjustment circuit for regulating the amplitude and phase of the signal from the third delay circuit;

an error amplifier for amplifying output signal from the second gain-phase adjustment circuit;

a fourth delay circuit for delaying phase of the another part of the output signals distributed by the second power divider; and a distortion cancellation power combiner for outputting composite signals composed of the output signals from the error amplifier and the signals from the fourth delay circuit.

BRIEF DESCRIPTION OF THE DRAWING

FIG. 11(a) is a diagram showing amplitude characteristic (transmission loss characteristic) of the output signal relative to changes in electrical length of an open-ended transmission line connected to the terminal-b of a conventional circulator; and FIG. 11(b) is a diagram showing time-delay characteristic of the output signals relative to changes in electrical length of an open-ended transmission line connected to the terminal-b of a conventional circulator.

Figure 1:
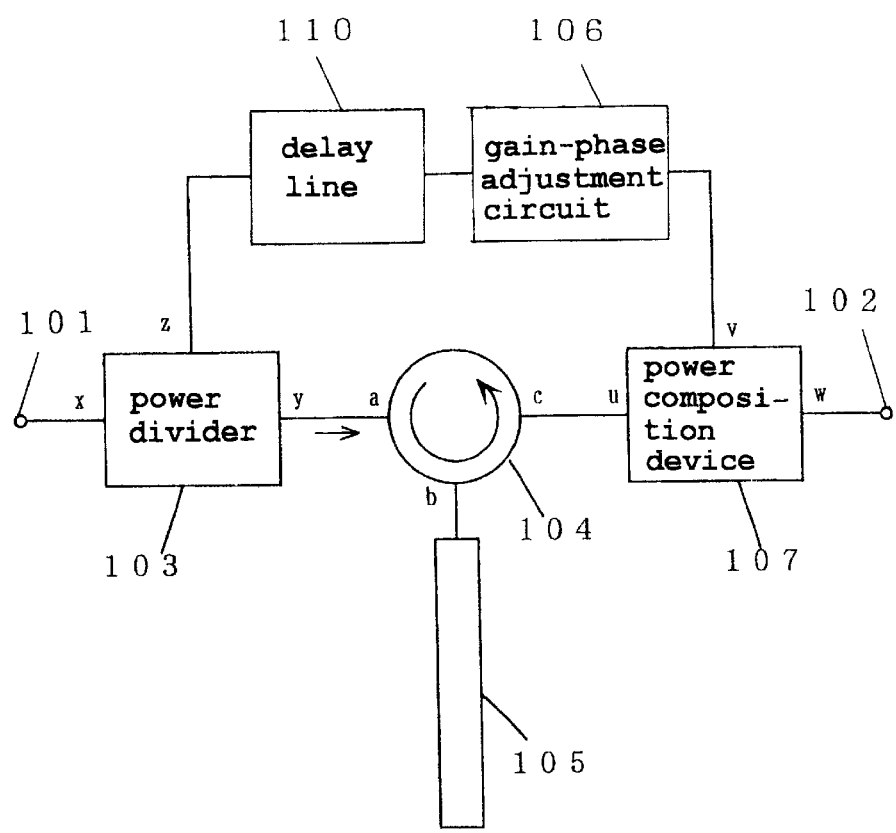
FIG. 1 is a block diagram of the delay circuit according to a first embodiment of the invention.

REFERENCE NUMERAL 101 input terminal;
102 output terminal;
103 power divider;
104 circulator;
105 open-ended transmission line;
106 gain-phase adjustment circuit;
107 power combiner;
110 delay line;
111 variable attenuator;
112 variable phase shifter;
113 capacity variable capacitor;
114 varactor diode;
121 temperature measuring device;
122 memory;
123 frequency characteristic correction circuit;
124 circulator;
125 terminal resistance
131 input terminal;
132 output terminal;
133,137 power dividers respectively;
134, 138, 140, 143 delay circuits respectively;
135, 141 vector regulation devices respectively;
136 main amplifier;
139 distortion detection power combiner;
142 error amplifier; and
144 distortion cancellation power combiner.

DETAILED DESCRIPTION OF THE PREFERRED EMBODIMENT

Now, referring to the drawings a description will be made about embodiments of the invention.

(First Embodiment)

Hereinafter, referring to the drawings, a description will be made about the delay circuit according to a first embodiment of the invention.

FIG. 1 is a block diagram of a delay circuit according to the first embodiment of the invention. Each terminal of a circulator 104 used in the circuit in FIG. 1 is given with reference symbol "a", "b" and "c" in this order in the direction that signals are transmitted. In FIG. 1, an input terminal 101 is connected with terminal-x of a power divider 103; terminal-y of the power divider 103 is connected with a terminal-a of the circulator 104. A terminal-b of the circulator 104 is connected with an open-ended transmission line 105 and a terminal-c is connected with a terminal-u of a power combiner 107. Further, a terminal-z of the power divider 103 is connected with a terminal-v of the power combiner 107 interposed with a delay line 110 and a gain-phase adjustment circuit 106. A terminal-w of the power combiner 107 is connected with an output terminal 102.

Figure 2:
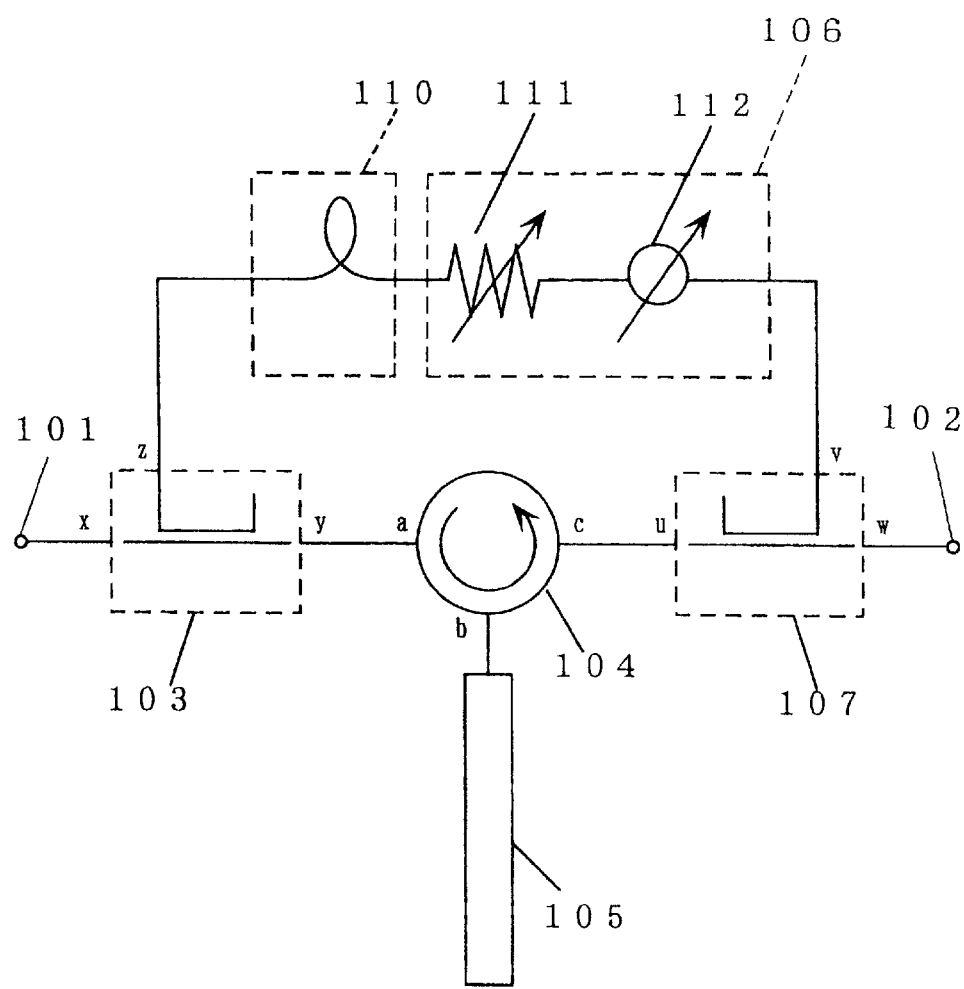
FIG. 2 is a circuit diagram of the delay circuit according to the first embodiment of the invention.

FIG. 2 shows a concrete circuit structure of the block diagram in FIG. 1. The power divider 103 and the power combiner 107 are both comprised of a directional coupler respectively. The delay line 110 is comprised of a semi-rigid cable. The gain-phase adjustment circuit 106 is comprised of a variable attenuator 111 and a variable phase shifter 112. And the open-ended transmission line 105 is comprised of a microstrip line formed on a dielectric substrate.

The terminal-a of the first embodiment is an example of a first terminal of the invention; the terminal-b of the first embodiment is an example of a second terminal of the invention; the terminal-c of the first embodiment is an example of a third terminal of the invention. The delay line 110 of the first embodiment is an example of a delay line of the invention; the gain-phase adjustment circuit 106 of the first embodiment is an example of a gain-phase adjustment circuit of the invention.

Figure 3:
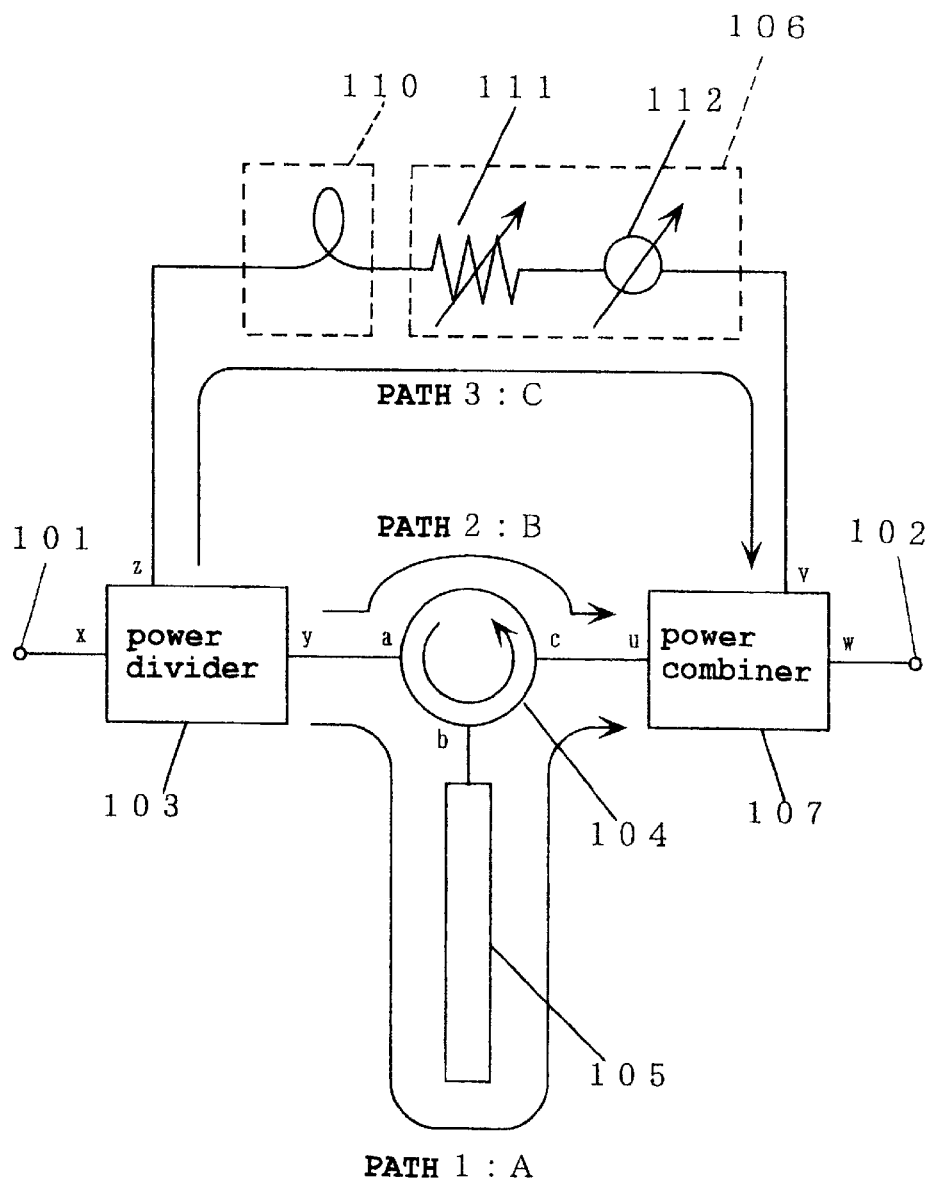
FIG. 3 is a diagram illustrating the operational principle of the delay circuit according to the first embodiment of the invention.

Now, referring to FIG. 3, a description will be made about a delay circuit thus constructed.

Signals inputted from the input terminal 101 are distributed into two parts by the power divider 103. One part of output signals out of the distributed signals into two parts are separated into a component that proceeds from the terminal-a to the terminal-b of the circulator 104 (path 1), and a component that proceeds to the terminal-c due to insufficient isolation between the terminals of the circulator (path 2).

The component that proceeds to the terminal-b is totally reflected at an open-end 105d of the open-ended transmission line 105 and returns to the terminal-b and is outputted to the terminal-c. Signals passing through the path 1 and the path 2 appear on a terminal-u of the power combiner 107.

Whereas, another part of output signals out of the signals distributed into two parts are delayed by the delay line 110 and is regulated by the variable attenuator 111 and the variable phase shifter 112 (path 3) and appears on the terminal-v of the power combiner 107.

On the output terminal 102, signals composed with respective signals from the path 1, path 2 and path 3 appear.

Herein, it is assumed that the signals that appear on the terminal-u through the path 1 are named as A; the signals that appear on the terminal-u through the path 2 are named as B; and the signals that appear on the terminal-V through the path 3 are named as C.

When the delay line 110, the variable attenuator 111 and the variable phase shifter 112 are adjusted so that the signals C which appear on the terminal-v through path 3 is composed with the signals B which appear on the terminal-u through path 2 at the terminal-w identical in amplitude and inverse in phase with each other, the signals B from path 2 and the signals C from path 3 are offset each other. Accordingly, only the signals A through path 1 appear on the output terminal 102.

That is to say, assuming now that the signals from path 2 are signal-B; the signals-C from path 3 are represented as below.

$$C = Be^{j\pi} \quad \text{[Formula 1]}$$

A further concrete description will be made about the adjustment method described above.

Tentatively, the open-end 105b of the open-ended transmission line 105 is terminated with a specific resistance (for example, 50Ω) interposed at the grounding side. Accordingly, the signals A flows to the ground and only the composed signals of the signals B and the signals C appear at the output terminal 102.

Then, the variable attenuator 111 and the variable phase shifter 112 are adjusted so that the composed signals, which appear at the output terminal 102, become 0.

After completing the above adjustment, the above-mentioned terminal end on the open-ended transmission line 105 is disconnected and restored to the original status.

By virtue of the adjustment described above, at the terminal-w, the signals B from path 2 and the signals C from path 3 are offset each other, and only the signals A from path 1 appear at the output terminal 102.

As described hereinbefore, in the mode of the first embodiment, as a circuit that offsets the signals from path 2 generated due to insufficient isolation on a circulator, by adding a circuit of path 3 for generating signals that has the identical amplitude and inverse phase thereto, only the signals that pass through path 1 appear on the output terminal 102.

Figure 4:
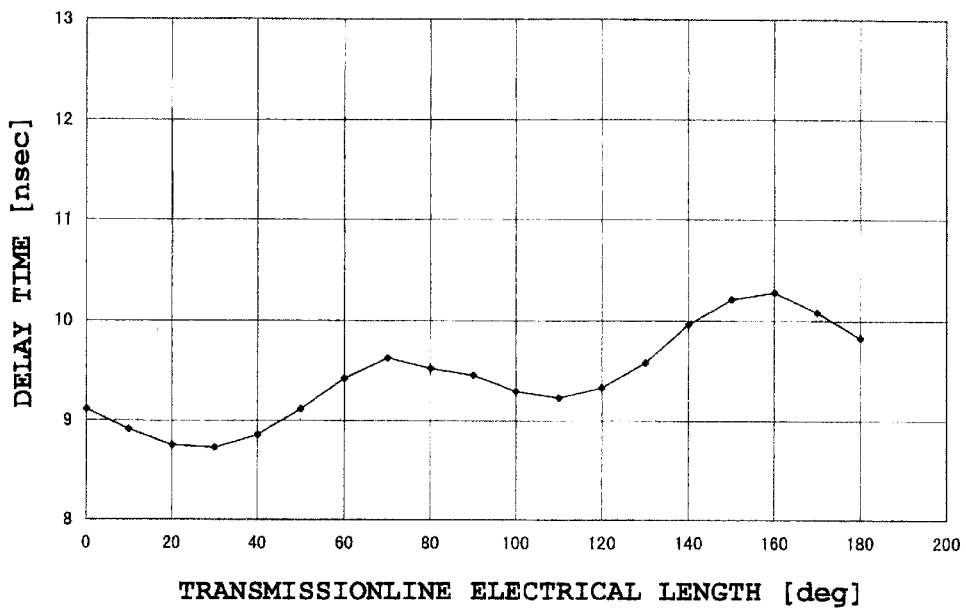
FIG. 4(a) is a diagram showing amplitude characteristic (transmission loss characteristic) of the output signals relative to changes in electrical length of an open-ended transmission line connected to the terminal-b of the circulator in the delay circuit according to the first embodiment.
FIG. 4(b) is a diagram showing time-delay characteristic of the output signal relative to changes in electrical length of an open-ended transmission line connected to the terminal-b of the circulator in the delay circuit according to the first embodiment.
Figure 4:
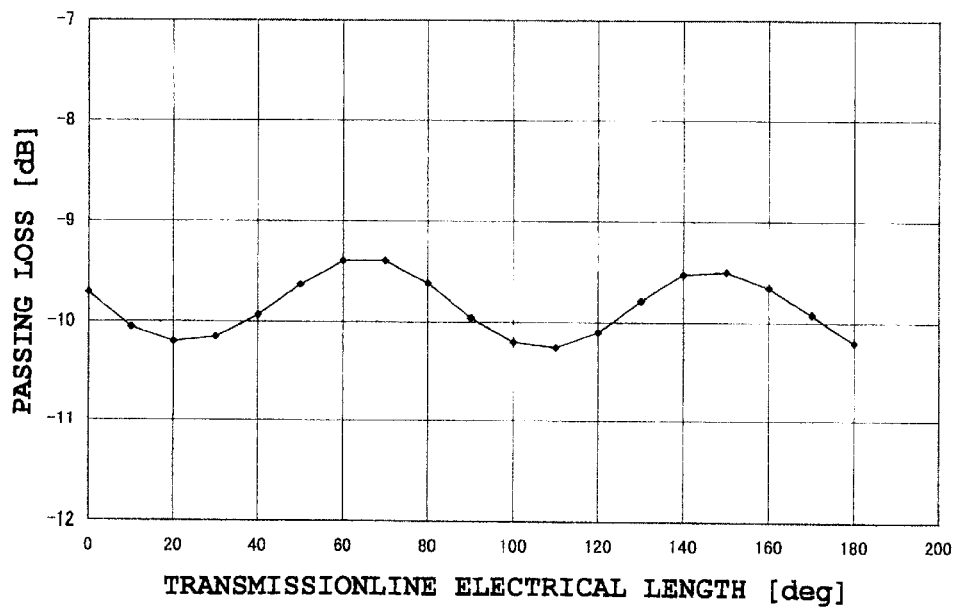

FIG. 4(A) and FIG. 4(B) show the delay time characteristic and the amplitude characteristic of the signals at the output terminal 102 relative to the electric length of the 105 in a delay circuit of the mode of the first embodiment.

As it is apparent from FIG. 4(A), comparing to the conventional case, relative to the changes in electrical length of the open-ended transmission line 105, the fluctuation range of the delay time of the output signals is smaller. Further, as a whole, a tendency is apparently observed that the larger electrical length of the transmission line is, the longer delay time is. Accordingly, in a delay circuit like this, to describe concretely, by adjusting the length of the transmission line, electrical length of the transmission line can be adjusted. Therefore, by virtue of this manner, it is made possible to adjust the delay time relatively easily to a desired value.

Furthermore, as it is also apparent from FIG. 4(B), by changing the length of the open-ended transmission line 105, it is made possible to provide a delay circuit that can reduce the fluctuation in the amplitude of the output signals.

Depending on the characteristic of the circulator, it is possible to eliminate the delay line 110. In such a case, the circulator has such characteristic, for example, that when the delay time of path 2 from the terminal-x through the terminal-y, -a, -c, -u and to the terminal-w is shorter than, or equal to the delay time of path 3 from the terminal-x through terminal-z, -v to the terminal-w (that is, delay time in case where the delay line 110 is not provided to path 3).

Further, as for the signals to be imputed from the input terminal 101, in case where the frequency characteristic of the circulator, the power divider and the power combiner, respectively, is flat, any signals within such frequency band may be used.

Furthermore, in the first embodiment, the delay line is comprised of a semi-rigid cable. However, it may be comprised of a coaxial line resulting in an identical effect.

Still further, in the first embodiment, the power combiner and the power divider are comprised of a directional coupler. However, they may be comprised of any other mode such as a resistant distribution-composition device, a Wilkinson type distribution-composition device or the like resulting in an identical effect.

(Second Embodiment)

Next, referring to the drawings, a description will be made about the delay circuit according to a second embodiment of the invention.

Figure 5:
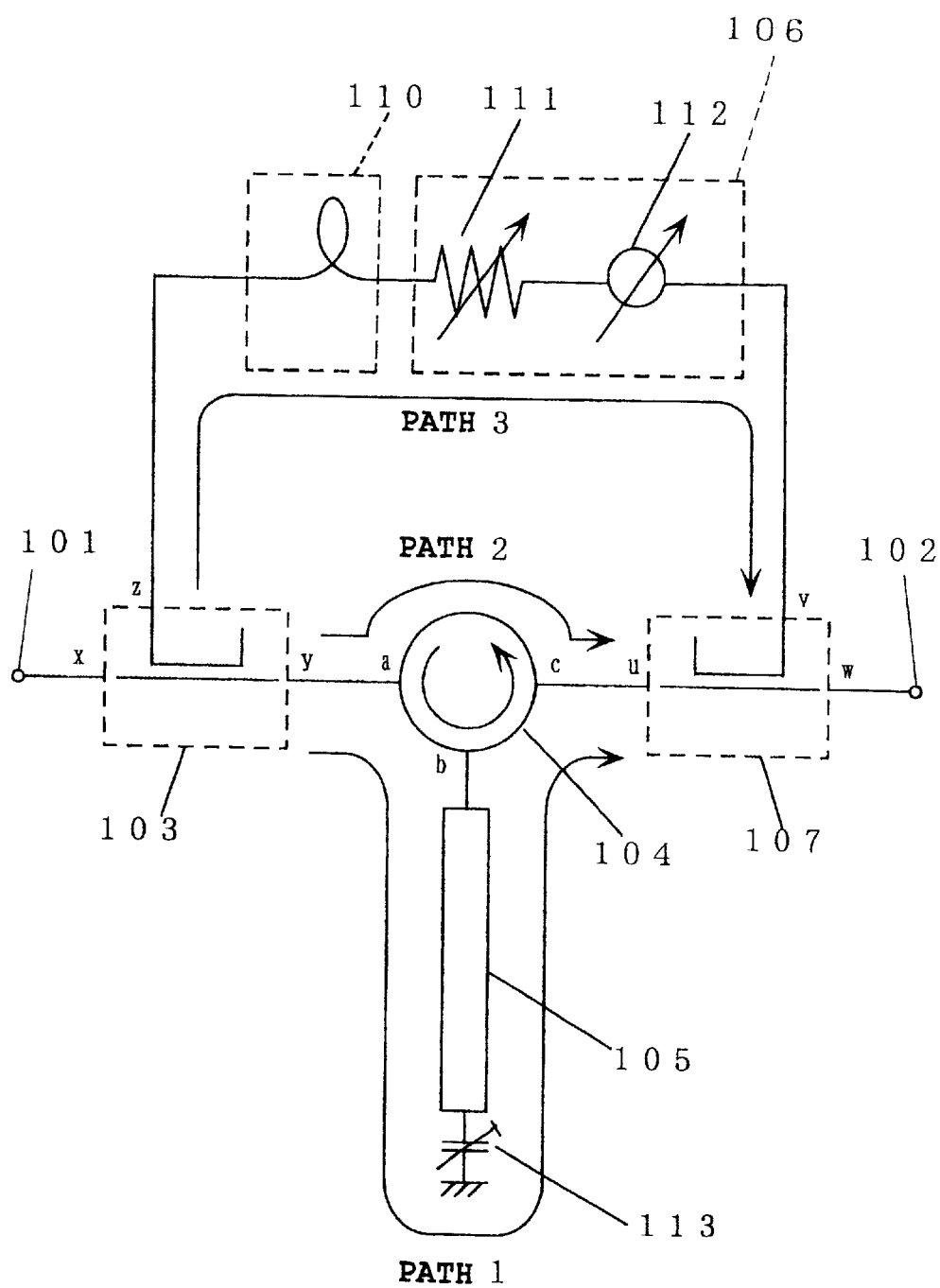
FIG. 5 is a circuit diagram of the delay circuit according to a second embodiment of the invention.

FIG. 5 shows a circuit diagram according to the second embodiment. In FIG. 5, an item that has the same structure as the first embodiment is given with the identical reference numeral as in FIG. 2.

In FIG. 5, an item different from the first embodiment is that a capacity variable capacitor 113 is interposed between the open-end of the open-ended transmission line 105 and the terminal of the ground. That is to say, in the second embodiment, it is different from the first embodiment a point that by changing the capacity value of the capacitor 113, it is made possible to change the electric length of the transmission line viewed from the terminal-b of the circulator 104 without changing the length of the open-ended transmission line.

In the second embodiment also, it is adapted so that the signals appear on the terminal-u through the path 2 and the signals appear on the terminal-v through the path 3 are offset each other at the terminal-w of the power combiner 107. As a result, only the signals through path 1 are outputted at the output terminal 102. The operation principle of this is the same as the first embodiment.

In a circuit structure according to the second embodiment, as described above, by changing the capacity value of the capacitor 113, it is made possible to change the electric length of the transmission line viewed from the terminal-b of the circulator 104 without changing the length of the open-ended transmission line. Accordingly, it is become easier to adjust the delay time of the delay line.

As a result, same as the case of the first embodiment, by changing the capacitance value of the capacitor also, it is made possible to provide a delay circuit capable to reduce the fluctuation range of the output amplitude.

Further, it is the identical as described in the first embodiment, that comparing to the conventional case, relative to the changes in electrical length of the open-ended transmission line 105, the fluctuation range of the delay time of the output signal s is smaller. Further, as a whole, a tendency is apparently observed that the larger electrical length of the transmission line, the longer delay time. Accordingly, in a delay circuit like this, to describe concretely, by adjusting the capacity value of the capacitor 113, electrical length of the transmission line can be adjusted. Therefore, by virtue of this manner, it is made possible to adjust the delay time relatively easily to a desired value.

As for the capacity variable capacitor 113 in the second embodiment, a trimmer capacitor capable to change the capacity value mechanically, or a varactor diode capable to change the capacity value by applying a voltage may be used. In case where a trimmer capacitor is used, as it is not necessary to add any additional circuit, it is made possible to reduce the cost.

Figure 6:
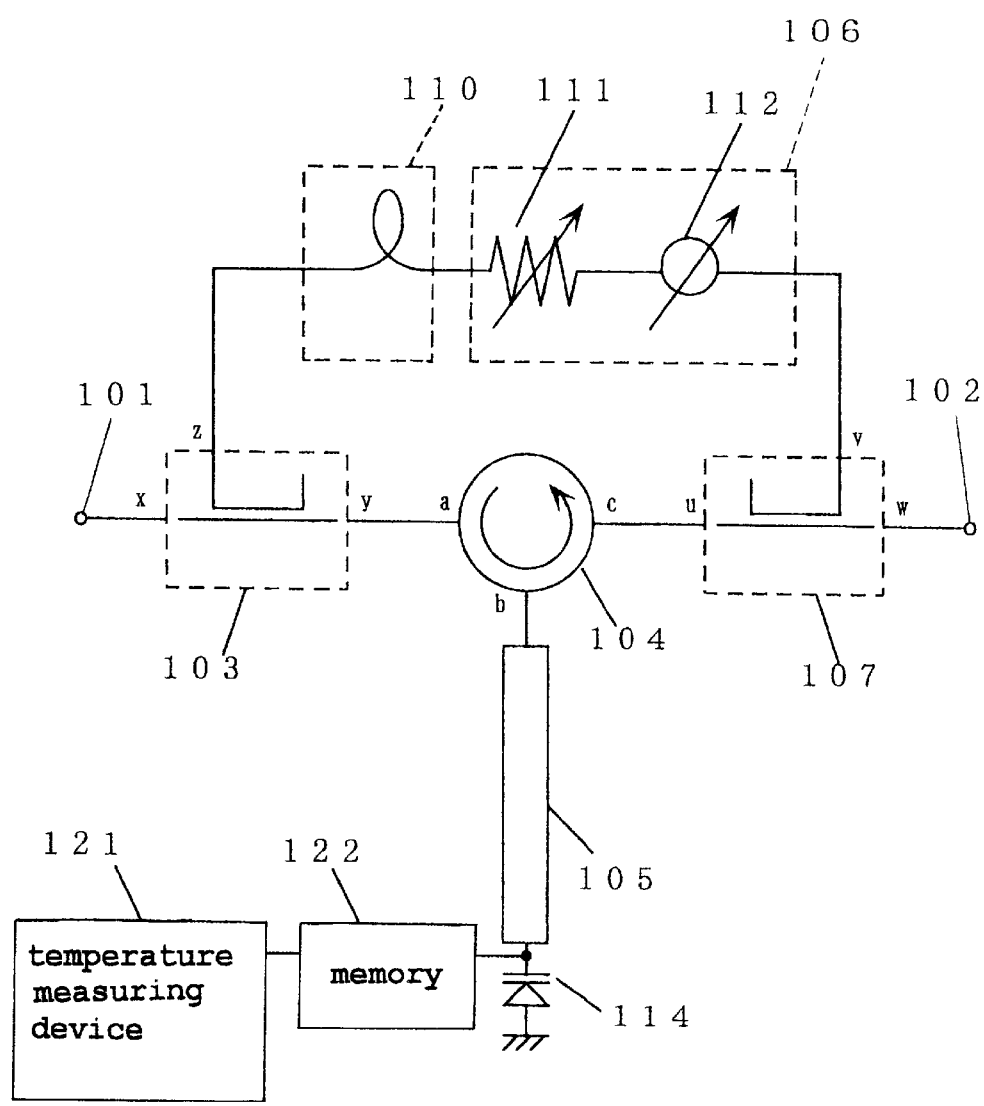
FIG. 6 is a circuit diagram of the delay circuit according to the second embodiment of the invention.

Whereas, FIG. 6 shows a circuit diagram of a case where a varactor diode 114 is used as a capacity-variable capacitor. In FIG. 6, the portion of the delay circuit is the identical as that in FIG. 5. Additionally, a temperature-measuring device 121 and a memory 122 are provided. Reference numeral 121 denotes a temperature-measuring device for measuring the temperature of the delay circuit; 122 denotes a memory. For example, by previously storing a voltage value corresponding to a capacity value of the varactor diode in the memory 122 for correcting fluctuation of the characteristic relative to the temperature, a voltage value to be given to the varactor according to a measured temperature is read out and the capacity of the varactor can be set automatically. As a result, it is made possible to provide a delay circuit of which characteristic is not changed irrespective of changes in temperature.

Depending on the characteristic of the circulator, same as the case described in the first embodiment, it is possible to eliminate the delay line 110.

Furthermore, in the second embodiment, the delay line is comprised of a semi-rigid cable. However, it may be comprised of a coaxial line resulting in an identical effect.

Still further, in the second embodiment, the power combiner and the power divider are comprised of a directional coupler. However, they may be comprised of any other mode such as a resistant distribution-composition device, a Wilkinson type distribution-composition device or the like resulting in an identical effect.

(Third Embodiment)

Next, referring to the drawings, a description will be made about the delay circuit according to a third embodiment of the invention.

Figure 7:
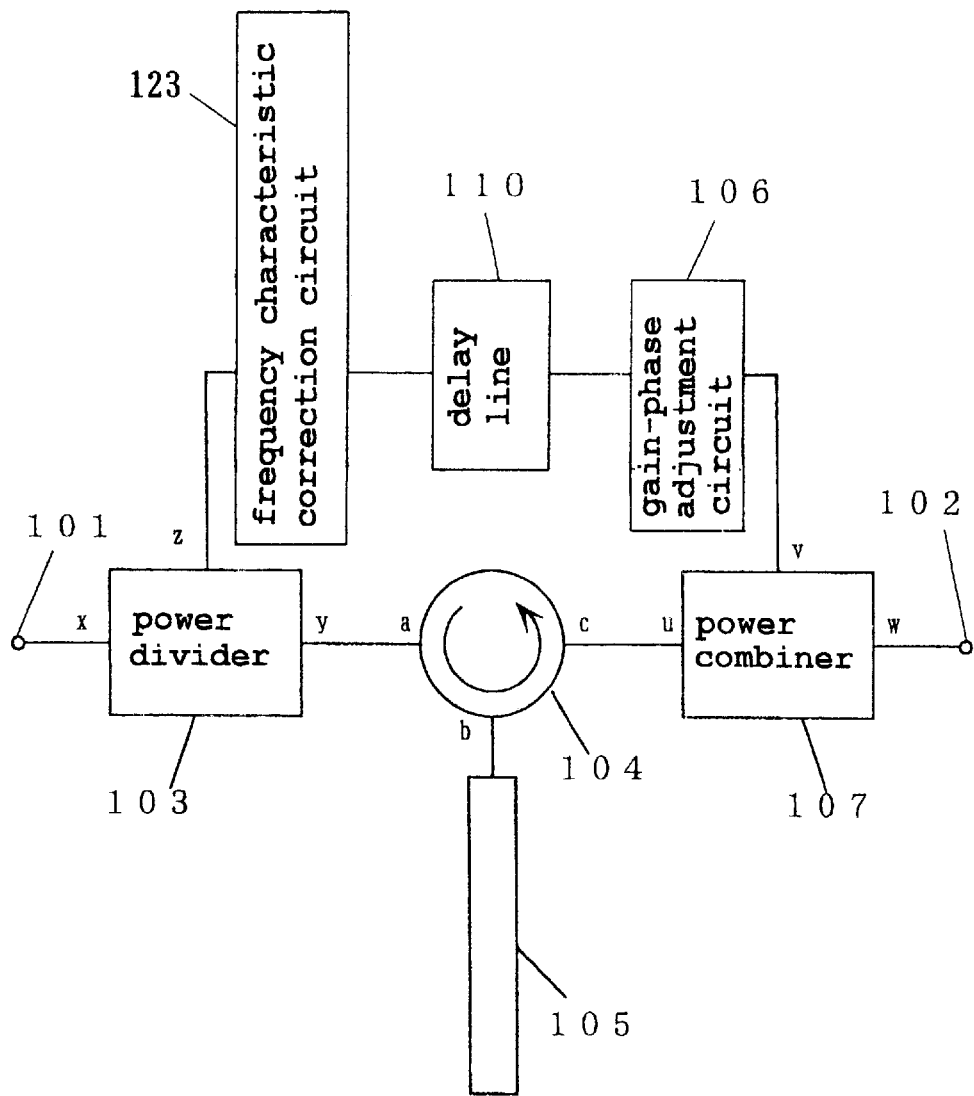
FIG. 7 is a block diagram of the delay circuit according to a third embodiment of the invention.

FIG. 7 shows a block diagram of the third embodiment. In FIG. 7, an item that has the same structure as the first embodiment is given with the identical reference numeral. In FIG. 7, item different from the first embodiment is that a frequency characteristic correction circuit 123 is interposed between the terminal-z of the power divider 103 and the delay line 110.

Figure 8:
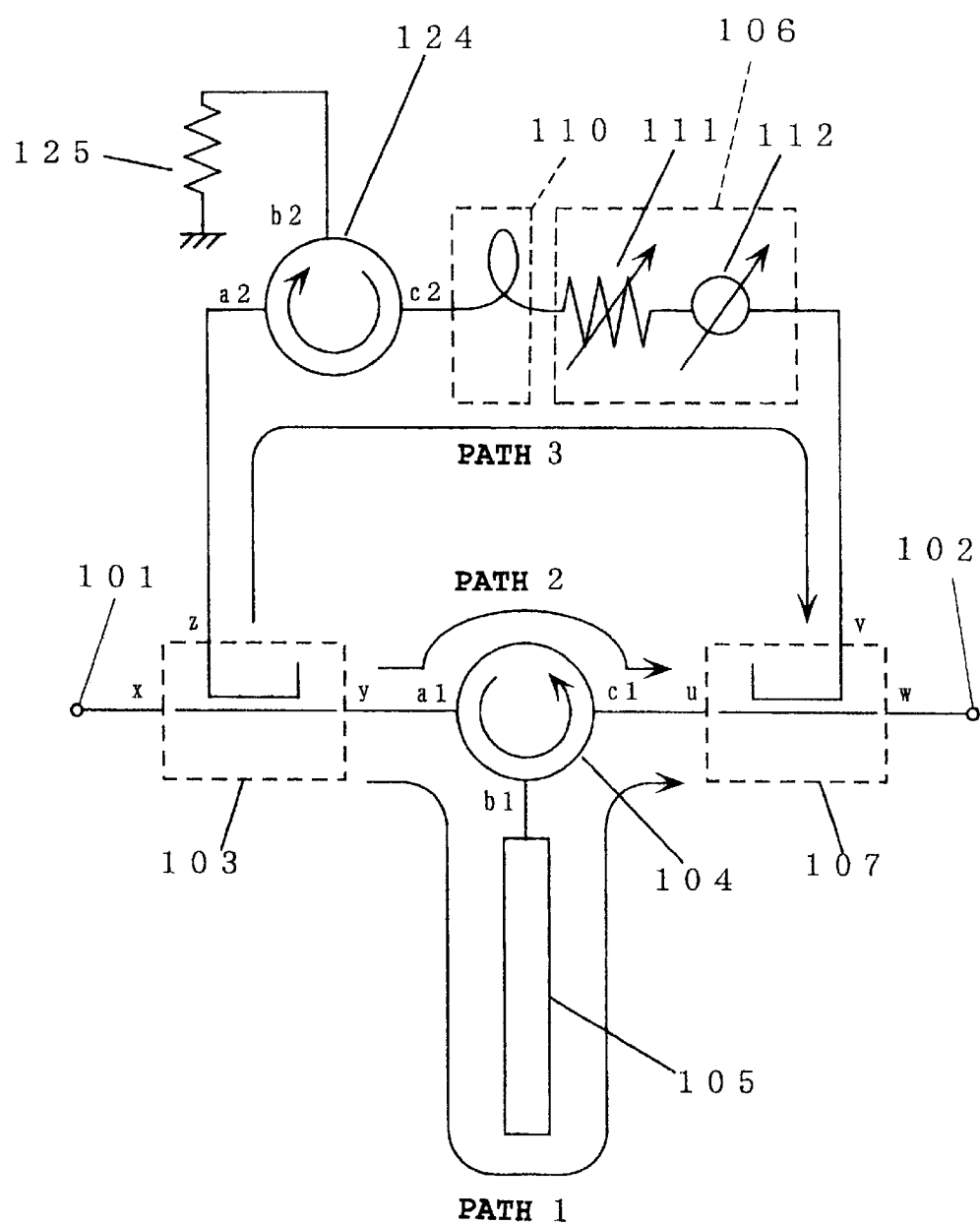
FIG. 8 is a circuit diagram of the delay circuit of the third embodiment of the invention.

FIG. 8 shows a concrete circuit structure of the block diagram shown in FIG. 7. Item, which has an identical structure as the first embodiment, is given with the same reference numeral as used in FIG. 2. For the frequency characteristic correction circuit 123 shown in FIG. 7, a circulator 124 that has the frequency characteristic similar to the frequency characteristic of the inter-terminal isolation characteristic of the circulator 104 and a terminal resistance 125 are used. Herein, the respective terminals of the circulator 104 are given with the reference numerals "a1", "b1" and "c1" in this order in the direction of transmission of the signals; whereas, the respective terminals of the circulator 124 are also given with the reference numerals "a2", "b2" and"c2" in this order in the direction of transmission of the signals. The terminal-z of the power divider 103 is connected with the terminal-a2 of the circulator 124. The terminal-c2 of the circulator 124 is connected with the delay line 110. The terminal-b2 of the circulator 124 is connected with the terminal resistance 125.

Hereinafter, a description will be made about the operation of the delay circuit structured as described above.

Basically, same as described in the first embodiment and the second embodiment, it is adapted so that the signals appear on the terminal-u through the path 2 and the signals appear at the terminal-v through the path 3 are offset each other at the terminal-w of the power combiner 107. Accordingly, only the signals through the path 1 are outputted on the output terminal 102. At this time, by adapting the isolation characteristic outputted from the terminal-a2 of the circulator 124 directly to the terminal-c2 so that the frequency characteristic is similar to the isolation characteristic outputted from the terminal-a1 of the circulator 104 directly to the terminal-c1, the frequency characteristics of the signals transmitted through the path 2 and the signals transmitted through the path 3 also become substantially identical with each other.

That is to say, at the terminal-w of the power combiner 107, the signals through the path 2 and the signals through the path 3 are offset each other over a wide range.

As a result, the frequency range in which only the signals through the path 1 are outputted becomes wide. Accordingly, it is made possible to provide a delay circuit capable to reduce the fluctuation range of the output amplitude in a wide range even when the electrical length of the open-ended transmission line is changed.

Further, it is the identical as described in the first embodiment that, comparing to the conventional case, relative to the changes in electrical length of the open-ended transmission line 105, the fluctuation range of the delay time of the output signal s is smaller. Further, as a whole, a tendency is apparently observed that the larger electrical length of the transmission line, the longer delay time. Accordingly, in a delay circuit like this, to describe concretely, by adjusting the length of the transmission line, electrical length of the transmission line can be adjusted. Therefore, by virtue of this manner, it is made possible to adjust the delay time relatively easily to a desired value.

Furthermore, in the third embodiment, a circulator is used in the frequency characteristic correction circuit. It is applicable to other circuit in case where the circuit has the identical isolation characteristic equivalent to the same of the circulator 104. For example, an isolator is applicable thereto. In that case also, the same effect will be obtained.

Still further, in the third embodiment, a full open-end is used for the open-end of the open-ended transmission line 105. As described in the second embodiment, it is possible to connect a capacity-variable capacitor at the open-end. In such case, both effects, that is, the effect obtained from the second embodiment and the effect obtained from the third embodiment, will be obtained.

Still furthermore, in the third embodiment, the gain-phase adjustment circuit, the delay line 110 and the frequency characteristic correction circuit are structured separately. However, it is possible to structure them integrally. For example, by adapting it so that the delay line 110 has the frequency characteristic similar to the isolation characteristic of a circulator, it will be made possible to reduce number of parts as well as to obtain the same effects as described above.

Depending on the characteristic of the circulator, it is possible to eliminate the delay line 110.

Furthermore, in the third embodiment, the delay line is comprised of a semi-rigid cable. However, it may be comprised of a coaxial line resulting in an identical effect.

Still further, in the third embodiment, the power combiner and the power divider are comprised of a directional coupler. However, they maybe comprised of any other mode such as a resistant distribution-composition device, a Wilkinson type distribution-composition device or the like resulting in an identical effect.

(Fourth Embodiment)

Next, referring to the drawings, a description will be made about a feedforward amplifier using a delay circuit according to a fourth embodiment of the invention.

Figure 9:
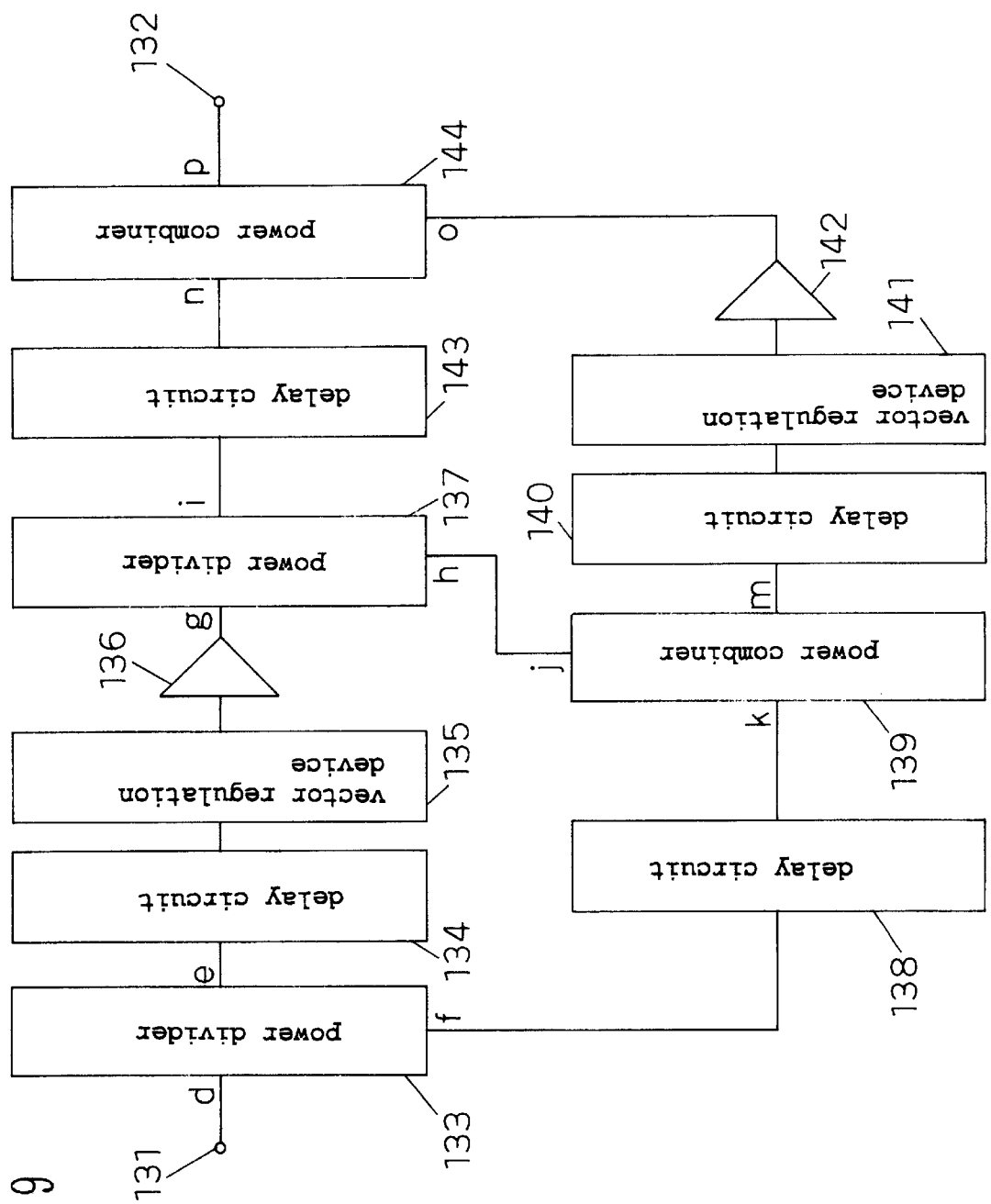
FIG. 9 is a block diagram showing a feedforward amplifier according to a fourth embodiment of the invention.
Figure 10:
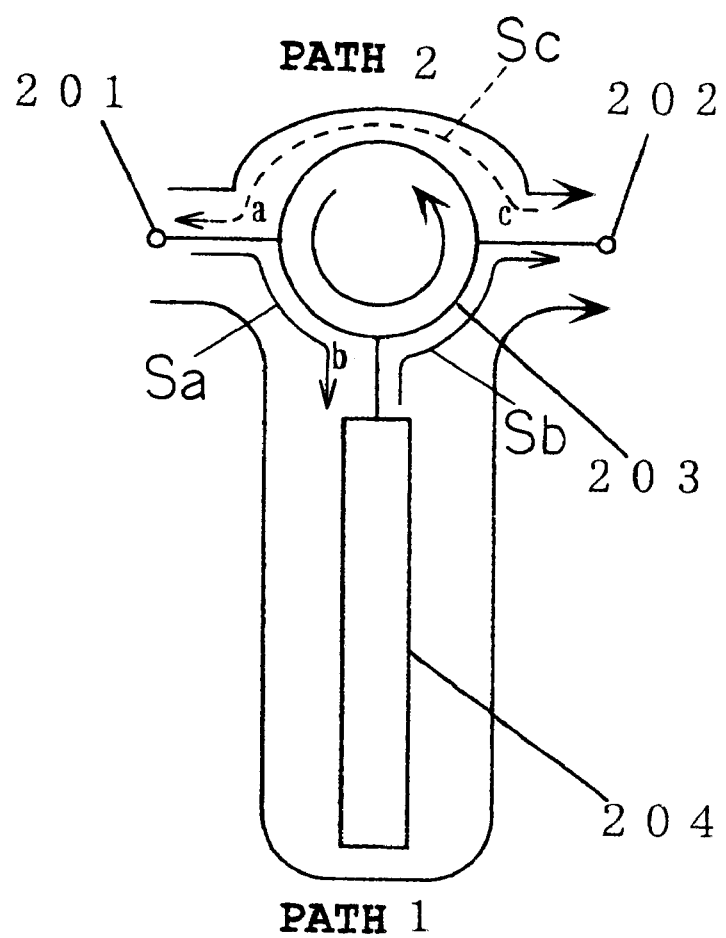
FIG. 10 is a circuit diagram of a conventional delay circuit.

FIG. 9 is a block diagram of a feedforward amplifier using a delay circuit according to the fourth embodiment of the invention. An input terminal 131 is connected with the terminal-d of the power divider 133. The terminal-e of the power divider 133 is connected with a main amplifier 136 for power amplifying of the input signals interposed with a delay circuit 134 and a gain-phase adjustment circuit 135. The output of the main amplifier 136 is connected with the terminal-g of the power divider 137; and the terminal-h of the power divider 137 is connected with the terminal-j of a distortion detection power combiner 139. Whereas, the terminal-f of the power divider 133 is connected with the terminal-k of the distortion detection power combiner 139 interposed with a delay circuit 138.

The terminal-i of the power divider 137 is connected with the terminal-n of the distortion cancellation power combiner 144 interposed with a delay circuit 143. The terminal-m of the distortion detection power combiner 139 is connected with an error amplifier 142 for amplifying the distortion signals interposed with a delay circuit 140 and a gain-phase adjustment circuit 141. The output of the error amplifier 142 is connected with the terminal-o of a distortion cancellation power combiner 144. The terminal-p of the distortion cancellation power combiner 144 is connected with an output terminal 132. In the fourth embodiment, for the delay circuits 134 and 140, the delay circuit according to the first embodiment of the invention is used.

Further, the power divider 133 of the fourth embodiment is an example of a first power divider of the invention. The delay circuit 134 of the fourth embodiment is an example of a first delay circuit of the invention. The gain-phase adjustment circuit 135 of the fourth embodiment is an example of a first gain-phase adjustment circuit of the invention. The power divider 137 of the fourth embodiment is an example of a second power distribution circuit of the invention. Furthermore, the delay circuit 138 of the fourth embodiment is an example of a second delay circuit of the invention. The power combiner 139 of the fourth embodiment is an example of a distortion detection power combiner of the invention. The delay circuit 140 of the fourth embodiment is an example of a third delay circuit of the invention. The gain-phase adjustment circuit 141 of the fourth embodiment is an example of gain-phase adjustment circuit of a second embodiment of the invention. The delay circuit 143 of the fourth embodiment is an example of the delay circuit of a fourth embodiment of the invention. The distortion cancellation power combiner 144 of the fourth embodiment is an example of a distortion cancellation power combiner of the invention.

A description will be made hereinafter about the operation of the feedforward amplifier constructed as described above.

The input signals including multi-channel components inputted from the input terminal 131 are distributed into two parts by the power divider 133.

A part of the signals out of the two-distributed signals are outputted from the terminal-e, and are delayed by the delay circuit 134, and then, the amplitude and phase thereof are regulated by the gain-phase adjustment circuit 135 and are amplified by the main amplifier 136. From the main amplifier 136, because the main amplifier 136 is nonlinear, the signals including distortion components due to mutual modulation among the multi-channel signals including the components of the input signals are outputted. The outputted signals are inputted into the terminal-g of the power divider 137 and the signals are distributed to the terminal-h and the terminal-i.

The signals outputted to the terminal-h are inputted to the terminal-j of the distortion detection power combiner 139.

The other part of signals out of the signals distributed into two parts by the power divider 133 are outputted from the terminal-f, is delayed by the delay circuit 138 and inputted to the terminal-k of the distortion detection power combiner 139.

At this time, by adjusting the gain-phase adjustment circuit 135, the delay circuit 134 and the delay circuit 138 so that the components of the input signals inputted to the terminal-j and the terminal-k become identical with each other in amplitude and inverse each other in phase, only the signals that include distribution components of the offset input signals are outputted from the terminal-m.

Next, the signals including distortion components only outputted from the terminal-m, are delayed by the delay circuit 140, the amplitude and phase thereof are regulated by the gain-phase adjustment circuit 141 and are amplified by the error amplifier 142. As a sufficient back-off is provided by the error amplifier 142 to prevent a new nonlinear distortion from occurring, the inputted distortion components are outputted while being amplified as they are by the amplifier 142. The signals are inputted to the terminal-o of the 144.

Whereas, the signals including distortion components outputted from the terminal-i are delayed by the delay circuit 143 and are inputted to the terminal-n of the 144.

At this time, by adjusting the gain-phase adjustment circuit 141, and the delay circuits 140, 143 so that the distortion components of the signals inputted to the terminal-o and the terminal-n become identical with each other in amplitude and inverse in phase, the distortion components are offset at the terminal-p, the signals, of which components of the input signals only are amplified, are outputted to the output terminal 132.

When a feedforward amplifier is actually manufactured, it is necessary to coincide the delay time of the signals from the terminal-e through the terminal-j and the delay time of the signals from the terminal-f through the terminal-k with each other as well as to coincide the delay time of the signals from the terminal-i through the terminal-n and the delay time of the signals from the terminal-m through the terminal-o with each other. However, in case where the delay time of the respective delay circuits are not variable, it is difficult to carry out adjustment.

Now, by using a delay circuit, that is capable to change the delay time easily described in the first embodiment of the invention, for the delay circuit 134, it is made possible to adjust easily the delay time of the signals from the terminal-e through the terminal-j and the delay time of the signals from the terminal-f through the terminal-k. Also, by using a delay circuit, that is capable to change the delay time easily described in the first embodiment of the invention, for the delay circuit 140, it is made possible to adjust easily the delay time of the signals from the terminal-i through the terminal-n and the delay time of the signals from the terminal-m through the terminal-o. As a result, the efficiency in mass production of the feedforward amplifier is increased.

In the fourth embodiment, the delay circuit of the first embodiment is used for a delay circuit capable to change the delay time. The same effect is also obtained by using the delay circuit of the second or third embodiment therefor.

Further, in the fourth embodiment, delay circuits capable to change the delay time are used for the delay circuits 134 and 140 shown in FIG. 9. However, the delay circuit can be used for any of the delay circuits 134, 138, 140 and 143. That is to say, it is enough to use the delay circuit described in the first-third embodiments for at least one or more delay circuits 134, 138, 140 and 143.

Furthermore, the gain-phase adjustment circuit of the invention is described, in the embodiments described above, as a means of adjusting the amplitude and phase of the inputted signals. However, not limited thereto, for example, a structure, in which either the amplifier or the phase is adjusted as described above, is also acceptable.

As described hereinbefore, by structuring a delay circuit so that the input signals are distributed into two parts, and then one part of the distributed signals is regulated by the gain-phase adjustment circuit so that the amplitude is identical and the phase is inverse with each other relative to the signals outputted from the terminal-a directly to the terminal-c of the circulator; and then composing the output signals of the gain-phase adjustment circuit with the signals outputted from the terminal-a to the terminal-c of the circulator using a power combiner to offset the both at the output terminal; finally only the signals from the input terminal to the output terminal through the open-ended transmission line are outputted, it is made possible to provide a delay circuit capable to reduce the ripples of the output signals relative to the electrical length of the open-ended transmission line.

Still further, by applying the delay circuit to a feedforward amplifier, it is made possible to adjust the feedforward amplifier easily as well as to increase the efficiency in mass production of the feedforward amplifiers.

As it has been cleared by the description made hereinbefore, comparing with a conventional manner, it is made possible by the invention to provide a delay circuit capable to reduce fluctuation in amplitude characteristic of the output signals as well as the fluctuation in delay time characteristic.

Further, it is made possible by the invention to provide a feedforward amplifier capable to carry out adjustment easily.

What is claimed is:

1. A delay circuit, comprising:

a power divider for distributing an input signal having an amplitude and a phase, said input signal having a first part, and a second part;

a circulator having a first terminal for inputting the first part of the input signal, a third terminal for outputting the signal inputted to the first terminal, a second terminal interposed between the first terminal and the third terminal, in which the circulator regulates a flow direction of the signal from the first terminal to the second terminal;

said circulator having a leakage signal flow from the first terminal directly to the third terminal without passing through the second terminal, said leakage signal having an amplitude and a phase;

an open-ended transmission line having a connected end connected to the second terminal and having an open-end at an end opposite to the connected end;

a gain-phase adjustment circuit for regulating the amplitude and/or phase of the second part of the distributed input signal sufficient to offset the leakage signal;

the amplitude of the gain phase adjustment circuit being substantially the same as the leakage signal and the phase of the gain phase adjustment circuit being substantially inverse relative to the phase of the leakage signal;

a power combiner for outputting composite signals composed of an output signal from the third terminal and an output signal from the gain-phase adjustment circuit.

2. A delay circuit according to claim 1, wherein the gain-phase adjustment circuit regulates the amplitude and phase, and the output signal from the gain-phase adjustment circuit are regulated so as to have substantially the same amplitude and substantially inverse phase relative to the signal leaked directly to the third terminal without passing through the second terminal, said leaked signal being a part of the signal inputted to the first terminal of the circulator.

3. A delay circuit according to claim 1 or 2, further comprising a delay line for delaying the phase of the second part of the distributed input signal, wherein the gain-phase adjustment circuit is coupled to the delay line for regulating the amplitude and phase of the signal from the delay line.

4. A delay circuit according to, claim 1 or 2, further comprising a frequency characteristic correction element for correcting a frequency characteristic of the second part of the distributed input signal, and for producing a signal from the frequency characteristic correction element, wherein the gain-phase adjustment circuit regulates the amplitude and phase of the signal from the frequency characteristic correction element.

5. A delay circuit according to claim 4, wherein the frequency characteristic of the frequency characteristic correction element is substantially the same as a frequency characteristic of a leaked signal of the circulator.

6. A delay circuit according to claim 5, wherein the frequency characteristic of said leaked signal is a frequency characteristic of the signal leaked directly to the third terminal without passing through the second terminal, said leaked signal being a part of signal out of the signal inputted to the first terminal.

7. A delay circuit according to claim 5, wherein the frequency characteristic correction element is a circulator having a fourth terminal, a fifth terminal and a sixth terminal, wherein the fourth terminal inputs the second part of the distributed input signal, the sixth terminal outputs signal, the fifth terminal is connected with a terminal resistance.

8. A delay circuit according to claim 5, wherein the frequency characteristic correction element is an isolator.

9. A delay circuit according to claim 1 or 2, further comprising a frequency characteristic correction element for correcting a frequency characteristic of the signal of the second part of the distributed input signal distributed by the power divider, and for producing a signal from the frequency correction element, and a delay line for delaying the phase of the signals from the frequency characteristic correction element, and for producing a signal from the delay line, wherein the gain-phase adjustment circuit regulates the amplitude and phase of the signal from the delay line.

10. A delay circuit according to claim 1, wherein a capacitor is interposed between the open-end and of the open-ended transmission line and ground.

11. A delay circuit according to claim 10, wherein the capacitor is a varactor diode.

12. A feedforward amplifier, comprising:

a first power divider for distributing input signal;

a first delay circuit for delaying phase of a part of signal distributed by the first power divider;

a first gain-phase adjustment circuit for regulating the amplitude and the phase of the signal from the first delay circuit;

a main amplifier for amplifying an output signals from the first gain-phase adjustment circuit;

a second power divider for distributing output signal from the main amplifier a second delay circuit for delaying phase of the other part of signal distributed by the first power divider;

a distortion detection power combiner for composing signal from the second delay circuit and a part of signal distributed by the second power divider;

a third delay circuit for delaying phase of the output signal from the distortion detection power combiner;

a second gain-phase adjustment circuit for regulating the amplitude and phase of the signal from the third delay circuit;

an error amplifier for amplifying output signal from the second gain-phase adjustment circuit;

a fourth delay circuit for delaying phase of the another part of the output signals distributed by the second power divider; and a distortion cancellation power combiner for outputting composite signals composed of the output signals from the error amplifier and the signals from the fourth delay circuit, wherein at least one of the first delay circuit, the second delay circuit, the third delay circuit and the fourth delay circuit comprises;

a circulator having a first terminal for inputting a part of signal out of the distributed input signal, a third terminal for outputting the signal inputted to the first terminal, a second terminal interposed between the first terminal and the third terminal, in which the circulator regulates a flow direction of the signal from the first terminal to the second terminal;

an open-ended transmission line connected with the second terminal and having an open-end at an end opposite to the connected end;

a third gain-phase adjustment circuit for regulating the amplitude and/or phase of the another part of signal out of the distributed input signal; and a power combiner for outputting composite signals composed of an output signal from the third terminal and an output signal from the gain-phase adjustment circuit.

* * * * *